United States Patent
Kenington et al.

(10) Patent No.: US 6,580,320 B1
(45) Date of Patent: Jun. 17, 2003

(54) SIGNAL PROCESSING APPARATUS

(75) Inventors: Peter Kenington, Chepstow (GB); Andrew Bateman, Bath (GB)

(73) Assignee: Andrew Corporation, Orland Park, IL (US)

( * ) Notice: Subject to any disclaimer, the term of this patent is extended or adjusted under 35 U.S.C. 154(b) by 0 days.

(21) Appl. No.: 09/913,367

(22) PCT Filed: Jan. 25, 2000

(86) PCT No.: PCT/GB00/00194
§ 371 (c)(1),
(2), (4) Date: Nov. 30, 2001

(87) PCT Pub. No.: WO00/48308
PCT Pub. Date: Aug. 17, 2000

(30) Foreign Application Priority Data

Feb. 12, 1999 (GB) .............................................. 9903179
Mar. 31, 1999 (GB) .............................................. 9907435

(51) Int. Cl.$^7$ ............................. H03F 1/30; H03F 3/66; H03F 3/68
(52) U.S. Cl. ...................... 330/149; 330/52; 330/124 R
(58) Field of Search ................................ 330/52, 124 R, 330/149

(56) References Cited

U.S. PATENT DOCUMENTS

| | | | |
|---|---|---|---|
| 5,093,637 A | | 3/1992 | Isota et al. |
| 5,252,930 A | | 10/1993 | Blauvelt |
| 5,321,710 A | * | 6/1994 | Cornish et al. ................ 372/26 |
| 5,770,971 A | | 6/1998 | McNicol |
| 5,850,305 A | * | 12/1998 | Pidgeon ....................... 359/187 |
| 6,166,601 A | * | 12/2000 | Shalom et al. ............... 330/151 |

FOREIGN PATENT DOCUMENTS

| | | |
|---|---|---|
| EP | 289130 | 11/1988 |
| GB | 2318938 | 5/1998 |
| WO | WO 92/20146 | 11/1992 |
| WO | WO 99 45640 | 9/1999 |
| WO | WO 00 02324 | 1/2000 |

* cited by examiner

*Primary Examiner*—Patricia T. Nguyen

(57) ABSTRACT

The predistortion circuit (200) predistorts the input signal to a non-linear signal processing device in order to linearise its output. The predistortion circuit (200) derives the predistortion by sampling the input at (210) and multiplies it with itself using mixers (multipliers) (220, 226, 230, 236, etc.) in order to generate various orders of distortion (212, 214, etc.) which are summed to provide the predistortion. Filter/time delay means (240, 242, 244) are incorporated in the paths which generate the orders of distortion in order to introduce a phase and/or amplitude variation with frequency into the distortion. The filter/time delay means can be implemented by adaptive filters in digital signal processing circuits (DSPs). The DSPs can sample the output of the signal processing device being linearised in order to obtain feedback for adapting the filter(s).

22 Claims, 15 Drawing Sheets

US 6,580,320 B1

SIGNAL PROCESSING APPARATUS

The present application relates to signal processing apparatus.

In particular, this application relates to signal processing apparatus in which an input signal is subject to intermodulation distortion (IMD) between its input and output. Amplifying circuits, such as those used in transmitters and receivers, can constitute signal processing apparatus of this type.

For example, an RF power amplifier (PA) can, under certain operating conditions, provide an output signal which is a distorted version of its input signal. The distorted output signal can contain IMD products 110, 112 (FIG. 1) appearing around the output components 114, 116 corresponding to the input spectrum 100.

It is known to compensate for IMD distortion by predistorting the input signal spectrum to signal processing apparatus such as a non-linear PA. One form of predistortion generator produces a predistortion comprising controlled quantities of higher order versions of the input signal and introduces it into the input signal prior to the latter's supply to the signal processing means suffering from distortion. In this type of predistorter, the predistortion can contain, for example, third order components created by cubing the input signal and fifth order components created by forming the product of the cube and the square of the input signal.

However, the type of predistorter just discussed does not satisfactorily linearise non-linear signal processing apparatus which inflicts unequal IMD on the input signal. FIG. 1 shows an example of an output spectrum of a PA exhibiting unequal IMD of an input spectrum comprising a pair of spaced tones of equal level (represented in the output spectrum as 114 and 116). The IMD components 110 and 112 have different levels and therefore their cancellation using the predistortion mechanism described above is less effective.

Most (but not all) quasi-linear (class A or AB) RF power amplifiers will exhibit a well-behaved IMD characteristic at narrow tone spacing values (e.g. a few kHz) and this may continue up to a few megahertz or even tens of megahertz in some carefully-designed amplifiers. However, if one considers the previous example of two input tones having the same level, the majority of amplifiers will begin to exhibit a varying degree of inequality between IMD products of the same order as the spacing of the input tones is increased.

There is a wide range of reasons why the IMD products are unequal, and these include AM—AM and AM–PM distortions within the amplifying device being applied at different phases and hence resulting in a degree of subtraction of one or other product (usually accompanied by a degree of addition to other product); imperfect power supply or bias decoupling resulting in baseband (tone-difference) modulations being applied to the signals—this modulation will almost always be partially out-of phase with the IMD products, hence causing the partial cancellation/addition outlined above; and reflection of unterminated harmonic distortion components from e.g. output combining networks causing additional (and again out-of-phase) IMD products to be generated in the amplifier output.

According to one aspect, the invention consists in distorting apparatus for altering an input signal to signal processing means so as to counter unequal intermodulation distortion (IMD) in the output signal of the signal processing means to make it more linear.

Advantageously, the distorting apparatus comprises generating means for generating a distortion signal from the input signal and comprises two parallel signal paths, which each receive the distortion signal, and compensating means located in at least one of the paths, the compensating means introducing a phase and/or amplitude variation with frequency into the distortion signal, and combining means for recombining the signals issuing from the two signal paths.

Preferably the compensating means is filter means or delay means.

In a preferred embodiment, the filter means is a digital filter implemented by a digital signal processor (DSP), and the filter's characteristics, are adapted in response to a feedback signal derived from the output signal of the signal processing means which is indicative of IMD components present therein.

Certain embodiments of the present invention will now be described, by way of example only, with reference to the accompanying figures, in which.

Figure 15:
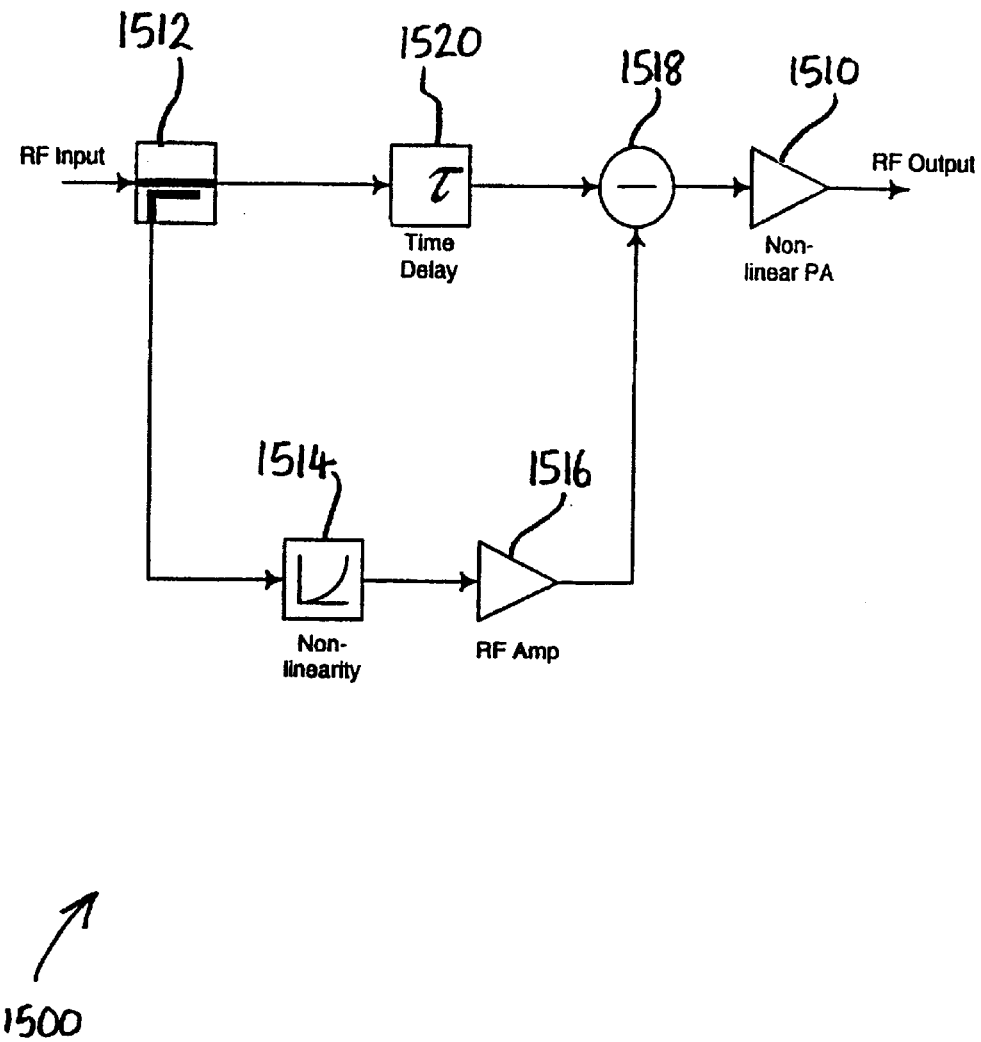
FIG. 15 is a diagram illustrating predistortion of an RF power amplifier to linearise its output.

FIG. 15 illustrates a circuit 1500 for linearising the response of a non-linear power amplifier 1510. A portion of the RF input to the amplifying 1510 is removed at coupler 1512 and is diverted from the main signal path to a predistortion circuit 1514. The output of the predistortion circuit 1514 is a distorted version of the input signal and this is amplified by amplifier 1516 prior to being recombined with the main signal path at 1518. The main signal path contains a time delay element 1520 which ensures that the signals travelling through the main and predistortion paths coincide at combiner 1518. The output from combiner 1518 is a predistorted version of the input signal which counters the distortion by the non-linear power amplifier 1510 in order to linearise its output response. The predistortion circuit 1514 can be controlled using a feedback signal derived from the output of the non-linear power amplifier 1510 in order to provide adaptive control, as will be discussed later.

Figure 1:
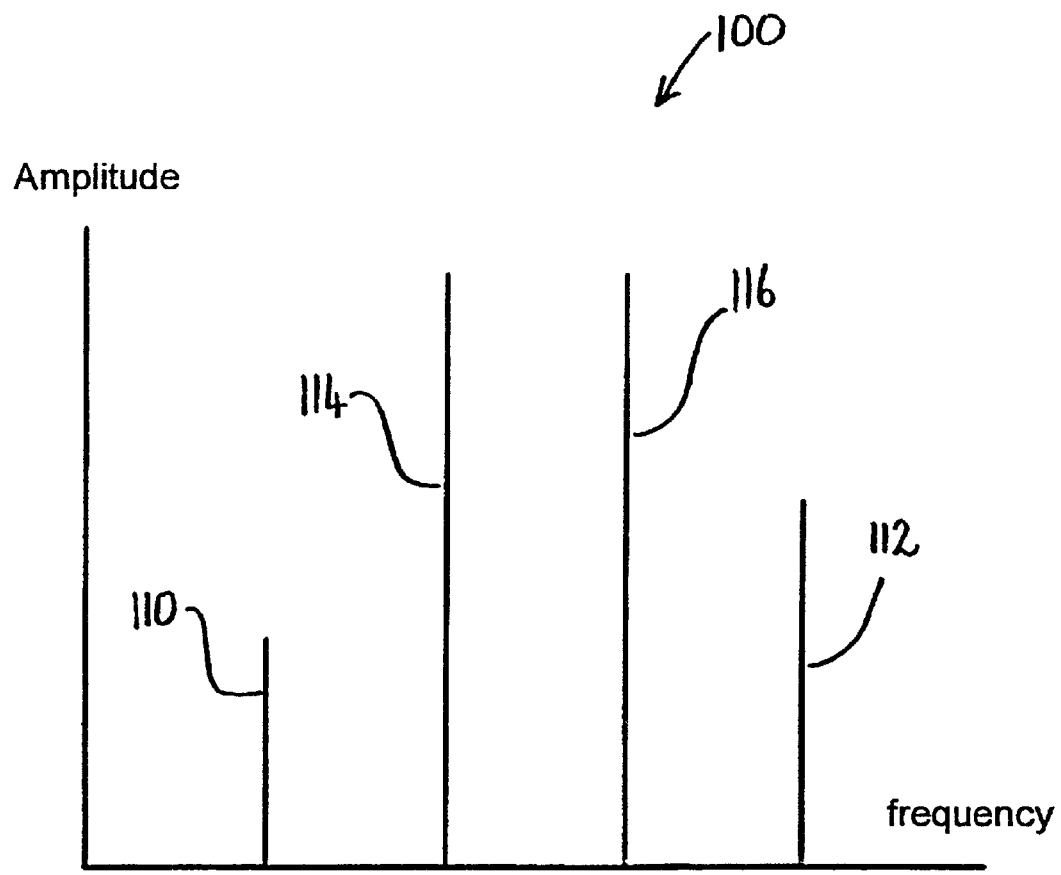
FIG. 1 is a diagram of a two-tone test exhibiting unequal IMD products.
Figure 2:
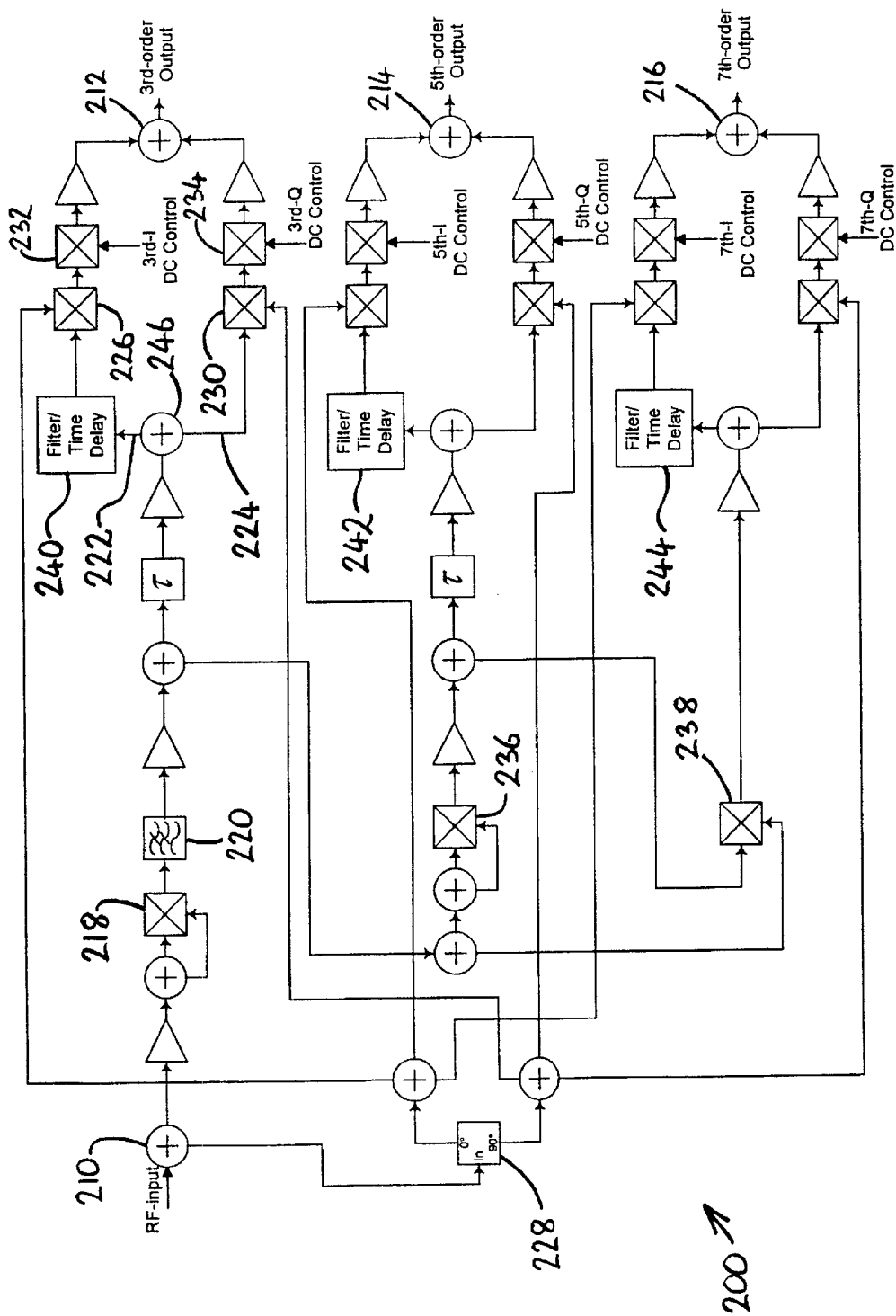
FIG. 2 is a diagram illustrating a portion of a predistortion generating circuit.

FIG. 2 shows a portion 200 of a predistortion circuit 1514 for countering unequal IMD in the output of signal processing apparatus, in this instance a non-linear RF power amplifier (PA) (1510, FIG. 15). The input to the PA is tapped (1512, FIG. 15) and is provided to the predistortion circuit at 210. In general terms, the predistortion circuit multiplies (or mixes) the input signal with itself to produce distortion components of various orders at 212, 214 and 216, which are recombined to form a predistortion signal which is injected into the input signal (1518, FIG. 15) prior to the PA in order to linearise its output.

The predistortion circuit shown generates three separate orders of distortion components: third, fifth and seventh order, each of which is susceptible of individual control. As will be clear to the skilled person, the predistortion circuit can be extended in a simple manner to produce further, higher order distortion components.

The process by which the separate distortion orders are generated is described in detail in earlier patent applications GB 9804835.8 and GB 9804745.9. Briefly, the third order distortion component is generated by squaring the input signal at mixer 218, low pass filtering the resulting signal using filter 220 and supplying the resultant signal to two parallel signal paths 222 and 224. In one of these branches, the signal is mixed (at 226) with the input signal to the PA (from 210), as supplied by the in-phase output (I) of quadrature splitter 228. In the other branch, the signal is mixed (at 230) with the quadrature output (Q) of the quadrature splitter 228. The outputs of mixers 226 and 230 are then each mixed with in-phase and quadrature control (dc) signals at mixers 232 and 234 respectively, in order to generate, on recombination at 212, a third order distortion component having the required phase and amplitude characteristics to optimise the predistortion signal. The I and Q dc control signals applied to mixers 232 and 234 are supplied by, for example, control circuitry (not shown) which monitors residual IMD in the output of the PA. Alternatively, the control circuitry could monitor cross modulation components around a pilot signal, as will be described later. The control circuitry could be implemented by a DSP.

The predistortion circuit is also arranged to generate a fifth order distortion component (at 214). Basically, this is achieved by squaring, using mixer 236, the low-pass-filtered output of squaring mixer 218, thus generating a fourth-order signal. This fourth order signal is then divided between two signal paths (analogous to paths 222 and 224 used for generating the third order distortion component) where the fourth order signal is mixed with I and Q versions of the sampled PA input signal from quadrature splitter 228, and with I and Q dc control signals from the control circuitry.

Similarly, a seventh order distortion component is produced at mixer 238 by forming the product of the squared PA input from mixer 218 with the fourth order output of mixer 236. The sixth order signal so produced is further mixed with I and Q versions of the PA input signal, etc. in a manner analogous to the generation of the third and fifth order distortion components to produce the independently controlled seventh order distortion component.

In this predistortion circuit, a defined characteristic of phase-shift vs frequency and/or amplitude variation vs frequency characteristic may be introduced in one or both of the parallel signal paths used to generate a given distortion component. This allows a variable (but defined) IMD inequality vs tone spacing to result from a given order of the predistortion circuit. This can then be arranged to match the PA distortion characteristic in this respect and hence provide broad band linearisation.

The frequency-variable characteristic referred to above is provided by a passive network 240 consisting of filter and/or time-delay elements which mimic the behaviour of the amplifier with varying tone-spacing. To take a simple example, the behaviour of the power supply decoupling circuitry can be mimicked using a similar (or even the same) network, if this is the major cause of IMD inequality at given values of tone spacing. This network is inserted into the baseband path of one of the channels which generates an order of the predistortion, e.g. into the low-pass filtered, second-order term of the third-order non-linearity at 240. This network 240 introduces a frequency-variable phase-amplitude characteristic which results in the required partial addition/cancellation process to remove the IMD inequality. The principle may, of course, be extended to any order and its application to 3rd, 5th and 7th orders is shown at 240, 242 and 244.

It is possible to vary the system shown in FIG. 2 in a number of ways. For example, the quadrature splitting process 228 may be removed from the input and placed as a part of each non-linearity order. This would not increase complexity, since it merely involves the replacement of in-phase splitters (e.g. 246) with quadrature splitters. (See FIG. 11 for the use of quadrature splitters).

The mixers may also be replaced by various forms of analogue multiplier without altering the system functionality and, furthermore, the passive filter/time delay networks need not be the same for each order of IMD generation since they may be tailored to suit the observed characteristics of each IMD order, for a given amplifier.

A possible drawback with the predistortion circuit of FIG. 2 arises from the use of passive, analogue networks in its attempt to match, at varying input tone frequency spacings, the behaviour of the device (in this case a PA) being linearised. Passive analogue networks restrict the range and type of characteristics which can be accommodated and also the degree of precision provided by the matching itself. The input power range over which good matching may be obtained is also restricted since it is not easy to adapt passive networks for varying input conditions.

Figure 3A:
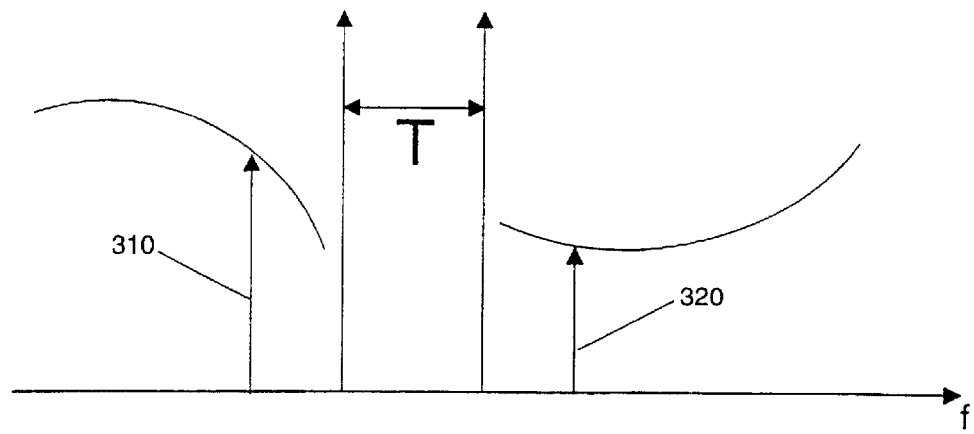
FIG. 3 is a diagram illustrating different IMD behaviours with varying tone spacing.
Figure 3B:
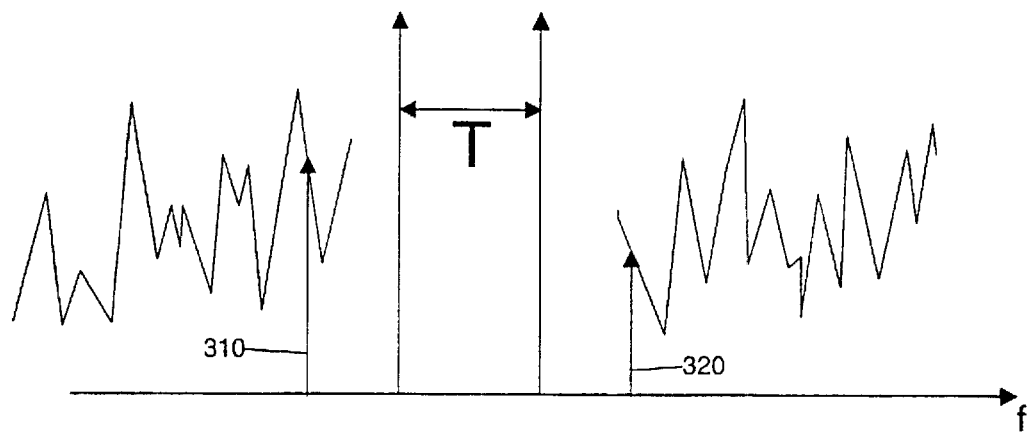

A passive, analogue filter network could, for example, be used to compensate for the IMD (310, 320) vs tone frequency spacing T shown in FIG. 3*a*, which exhibits smooth, continuous variation. However, such a filter network may not be suitable for compensating IMD (310, 320) which varies with tone frequency spacing T in an irregular, discontinuous manner, as shown in FIG. 3*b*.

Figure 4:
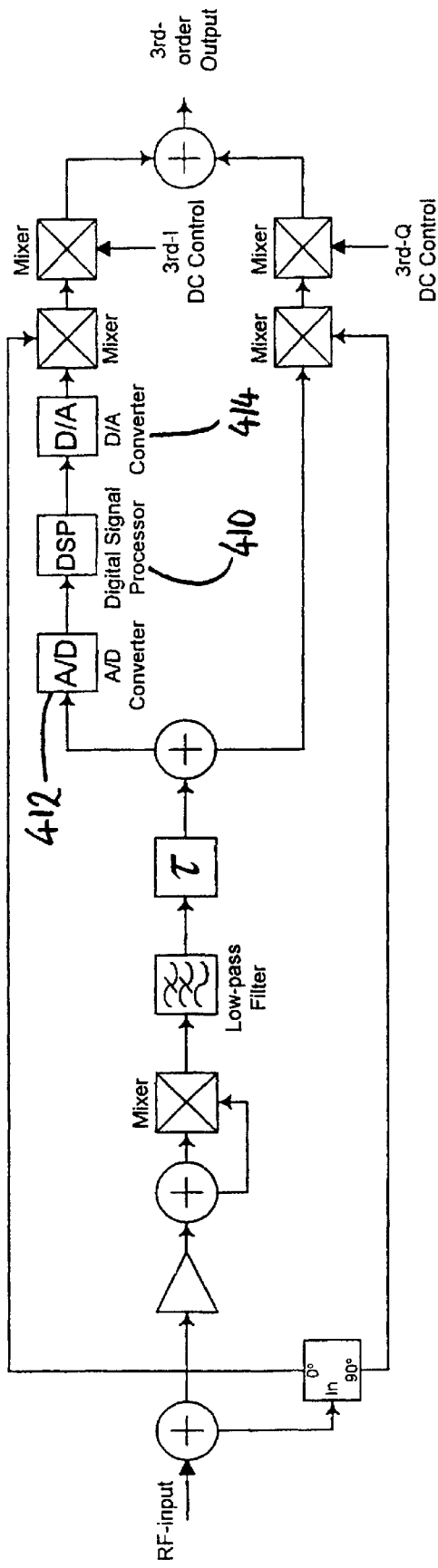
FIG. 4 is a diagram of a part of a predistortion circuit incorporating a DSP for generating an arbitrary phase-amplitude characteristic with tone spacing.

As illustrated in FIG. 4, the passive, analogue network can be replaced by a DSP in order to provide compensation for an arbitrary IMD vs tone spacing characteristic. This diagram illustrates only the portion of the predistortion circuit which produces the third order distortion component (as will be apparent on comparison with FIG. 2), but the principle may be extended to the portions of the previous distortion circuit which produce the distortion components of other orders. The DSP 410 and its associated converters 412 and 414 are arranged to sample at more than twice the maximum bandwidth (tone spacing) required of the system in order to avoid aliasing effects. When this criteria is fulfilled, the DSP 410 may operate in a number of ways in order to provide the required IMD vs tone spacing characteristic. For example the DSP may perform a Hilbert transformation of its input signal followed by an amplitude based spectrum equalisation or, instead, the DSP may implement an adaptive recursive or non-recursive filter or bank of filters. Additionally, the DSP could perform a combination of the above. It will be apparent that the DSP-based filter characteristic need not be the same for each distortion component for which it is employed.

Figure 5:
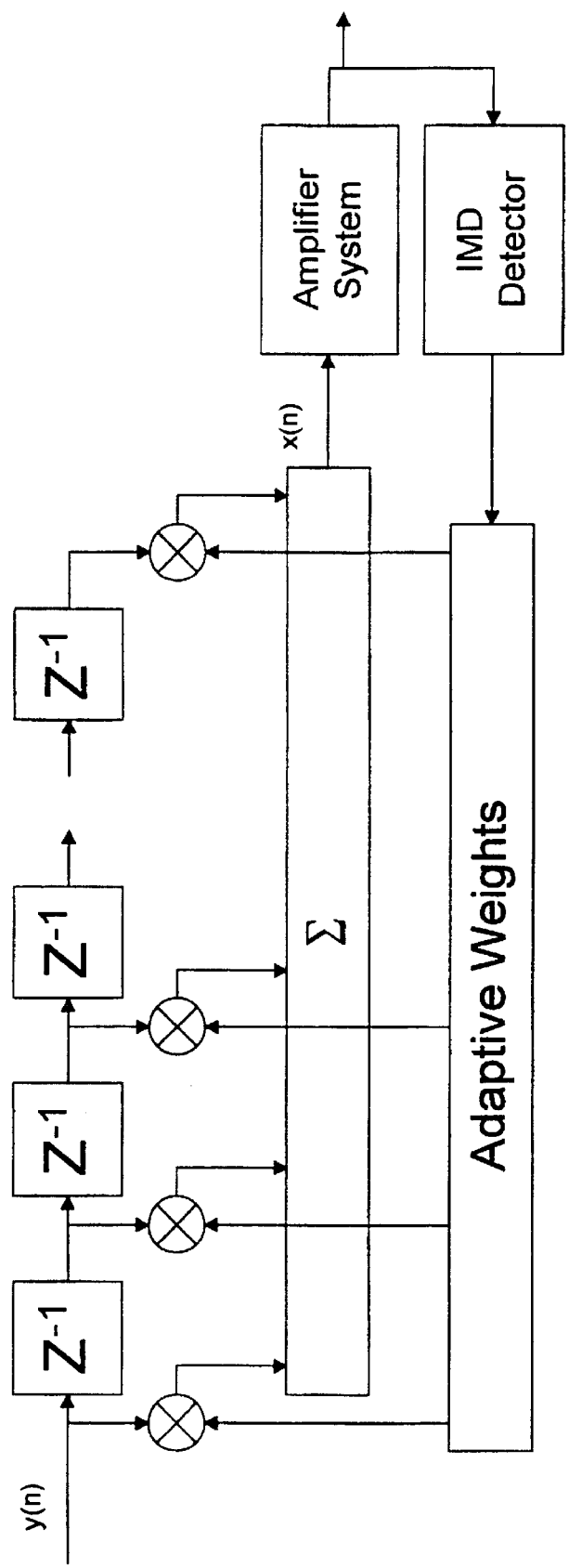
FIG. 5 is a block diagram of a nonrecursive adaptive filter such as maybe implemented by the DSP shown in FIG. 4.

There are numerous architectures for implementing adaptive digital filters which can be used to perform the gain and phase matching task in the predistortion circuit. FIG. 5 shows a block diagram for a standard non-recursive, FIR-based adaptive filter, which is commonly used in communication systems. The coefficients used in the filter are adapted on the basis of detected IMD in the output of the PA being linearised.

Figure 6:
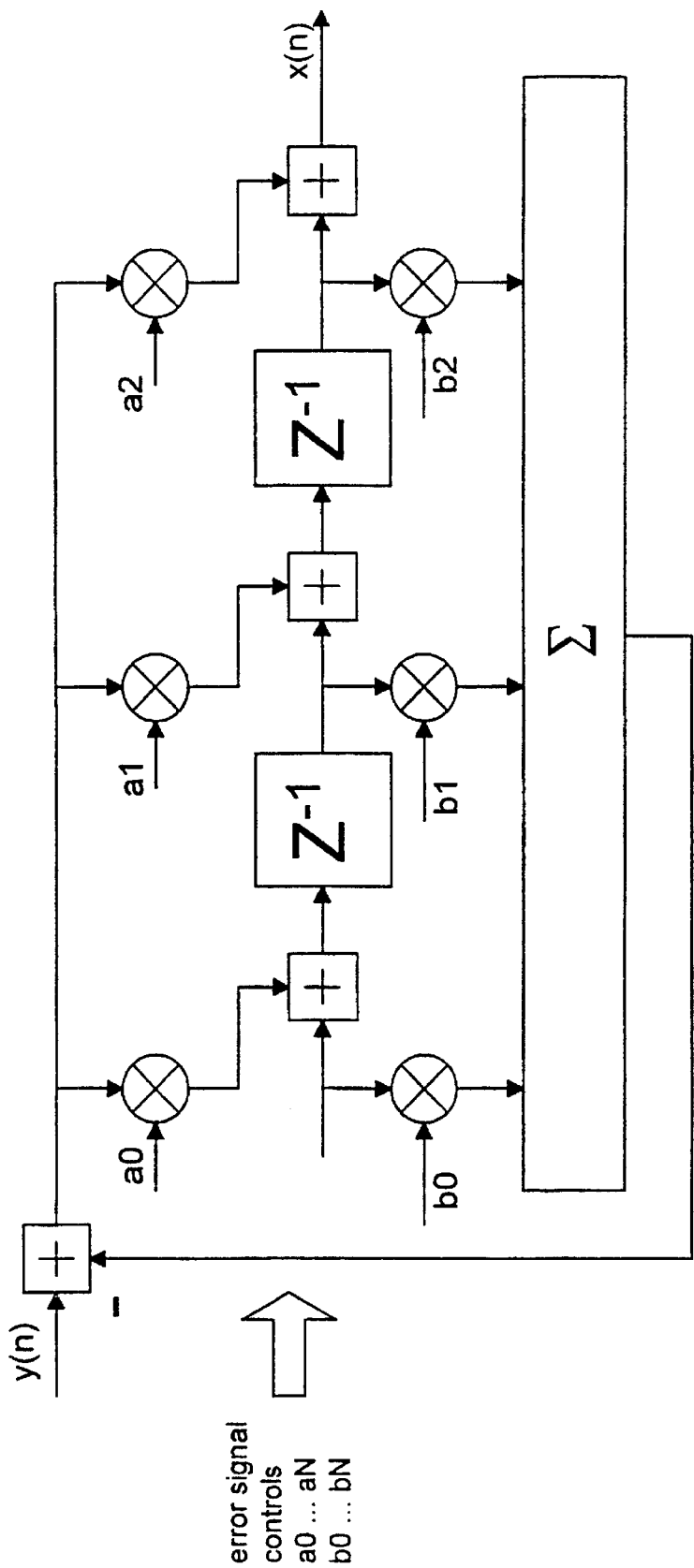
FIG. 6 is a block diagram of a recursive adaptive filter which maybe implemented by the DSP of FIG. 4.

FIG. 6 shows an equivalent recursive version of the filter, commonly employed with the Kalman adaptive filter algorithm. The coefficients an,bn are derived from residual IMD in feedback from the PA.

Figure 7:
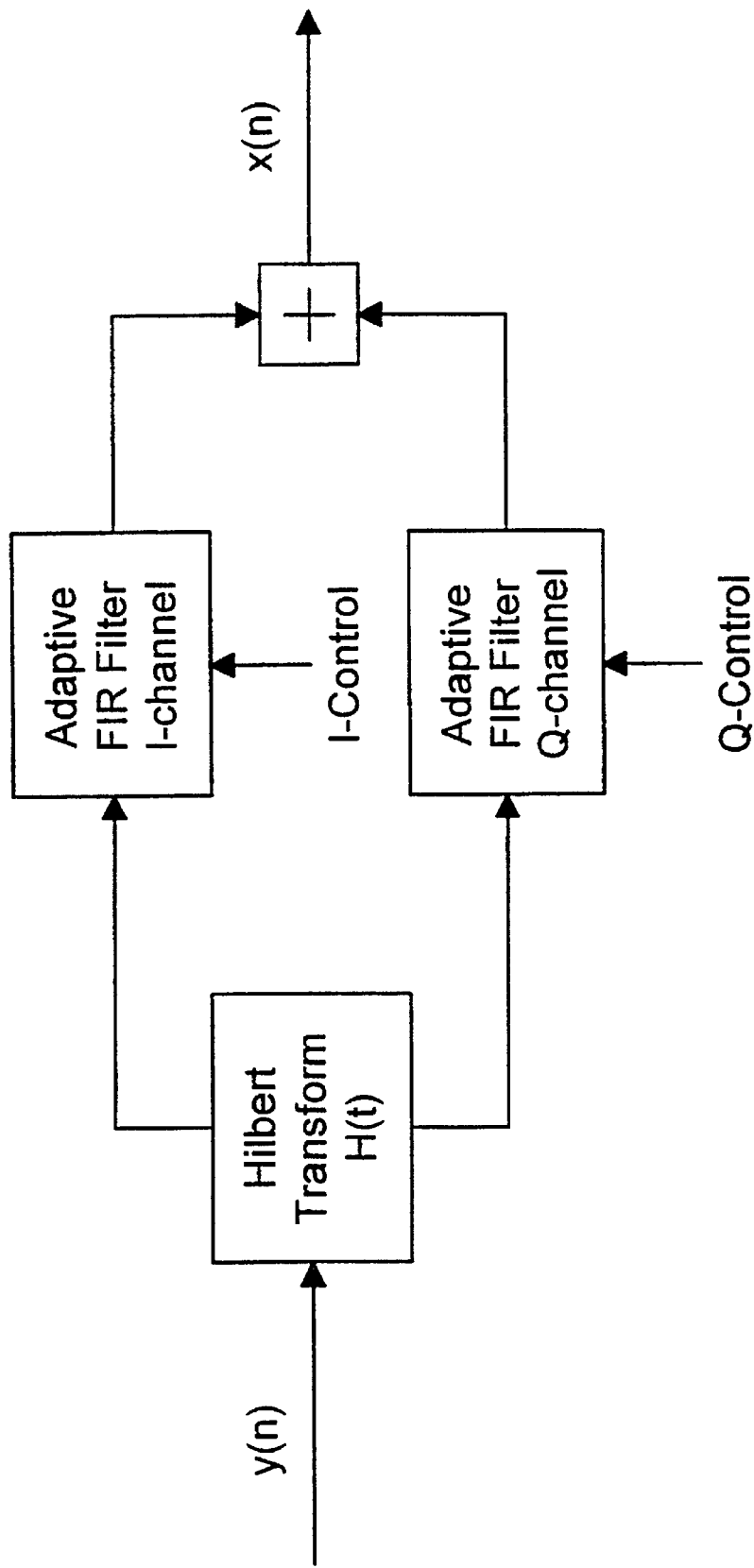
FIG. 7 is a block diagram of a Hilbert Transforrn based adaptive filter which maybe implemented by the DSP of FIG. 4.

FIG. 7 shows an implementation of an adaptive filter using two constant linear phase filters with gain-only adaption. These filters are placed within a Hilbert Transform sub-system and can be independently controlled using in-phase (I) and quadrature (Q) channel correction signals derived by the control system for the predistortion circuit.

Figure 8:
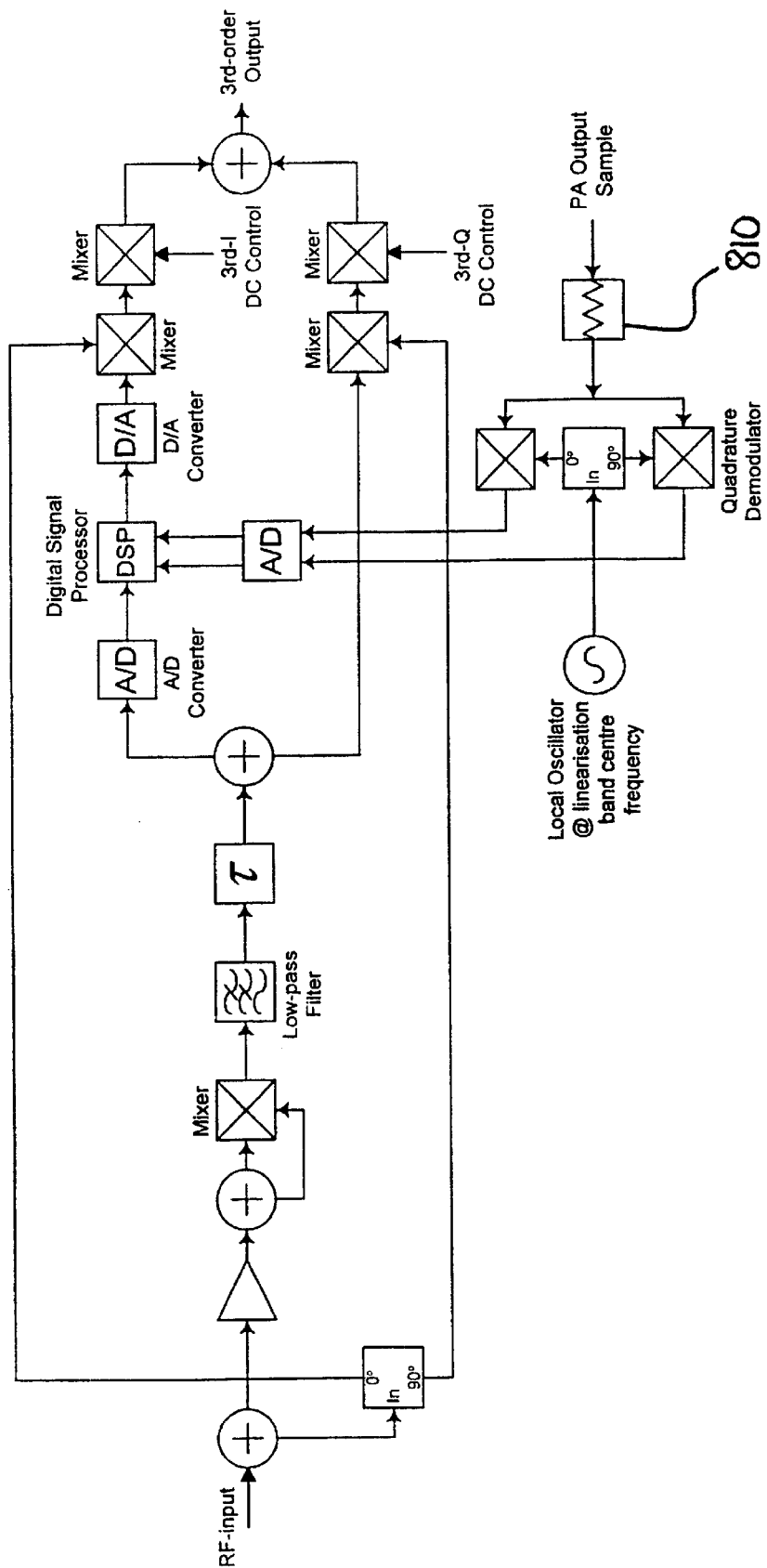
FIG. 8 illustrates the incorporation of feedback based IMD characteristic optimisation.

FIG. 8 extends the embodiment of FIG. 7 by the incorporation of a quadrature feedback path in order to allow the DSP filter to become adaptive, based on the correction performance achieved by the overall predistortion circuit. This adaption allows the system to optimise its performance at any input power level, tone spacing or operating frequency and hence is an extremely versatile modification. The output from the PA is attenuated at 810 and is demodulated using a quadrature modulator to provide I and Q correction signals which undergo analogue to digital conversion and are supplied to the DSP in order to provide the I-control and Q-control signals of FIG. 7.

It is also possible to use the correlation of the cross-modulation products appearing around a pilot tone as a measure of the residual system distortion of a particular order. A pilot tone based predistortion control mechanism is disclosed in GB 9814391.0. Basically, a pilot tone can be injected into, e.g., the input to a PA before its supply to the PA and cross modulation distortion (CMD) on the pilot signal from the input signal is used as feed back in the control system for the predistortion circuit (since the CMD on the pilot and IMD on the input being amplified are related, minimisation of the CMD equates to minimisation of the IMD). The same DSP could be used to provide the control signals for each order of distortion (i.e. the third-I DC control and third-Q DC control signals shown in FIG. 8) and to perform the filtering operations, and would be able to assess the level of the remaining and cancelled IMD and thereby vary the filter parameters in a logical sequence in order to further reduce the IMD. This mechanism has the advantage that only narrow band sampling of the feedback (correlated) signals is required and no additional local oscillator is necessary. It has the potential disadvantage, however, that only a single overall measure of IMD level is provided, which does not yield separate information on the relative IMD levels and differing tone spacing in a multi-tone signal.

Figure 9:
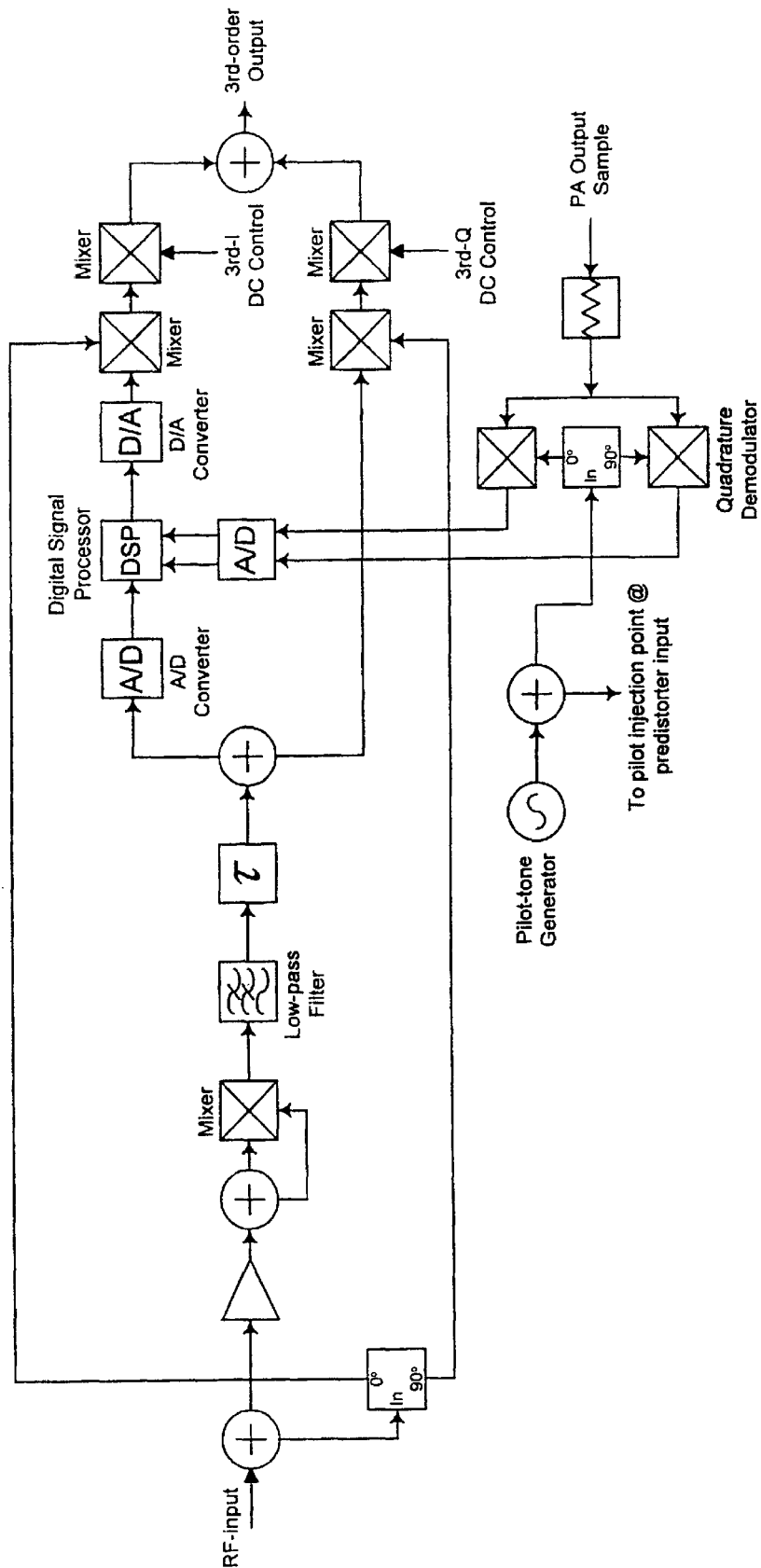
FIG. 9 illustrates the modification of FIGS. 8 to utilise and injected pilot tone for DSP filter control.

In such a system, in which cross modulation distortion on a pilot tone is used to derive the control signals for the predistortion circuit, the pilot tone may be used with the quadrature down conversion process as shown in FIG. 9. This allows coherent down conversion of the cross modulation products and hence provides a measure of the IMD level vs tone spacing in a multi-tone environment. The filter adaption may therefore be based directly upon this information.

Figure 10:
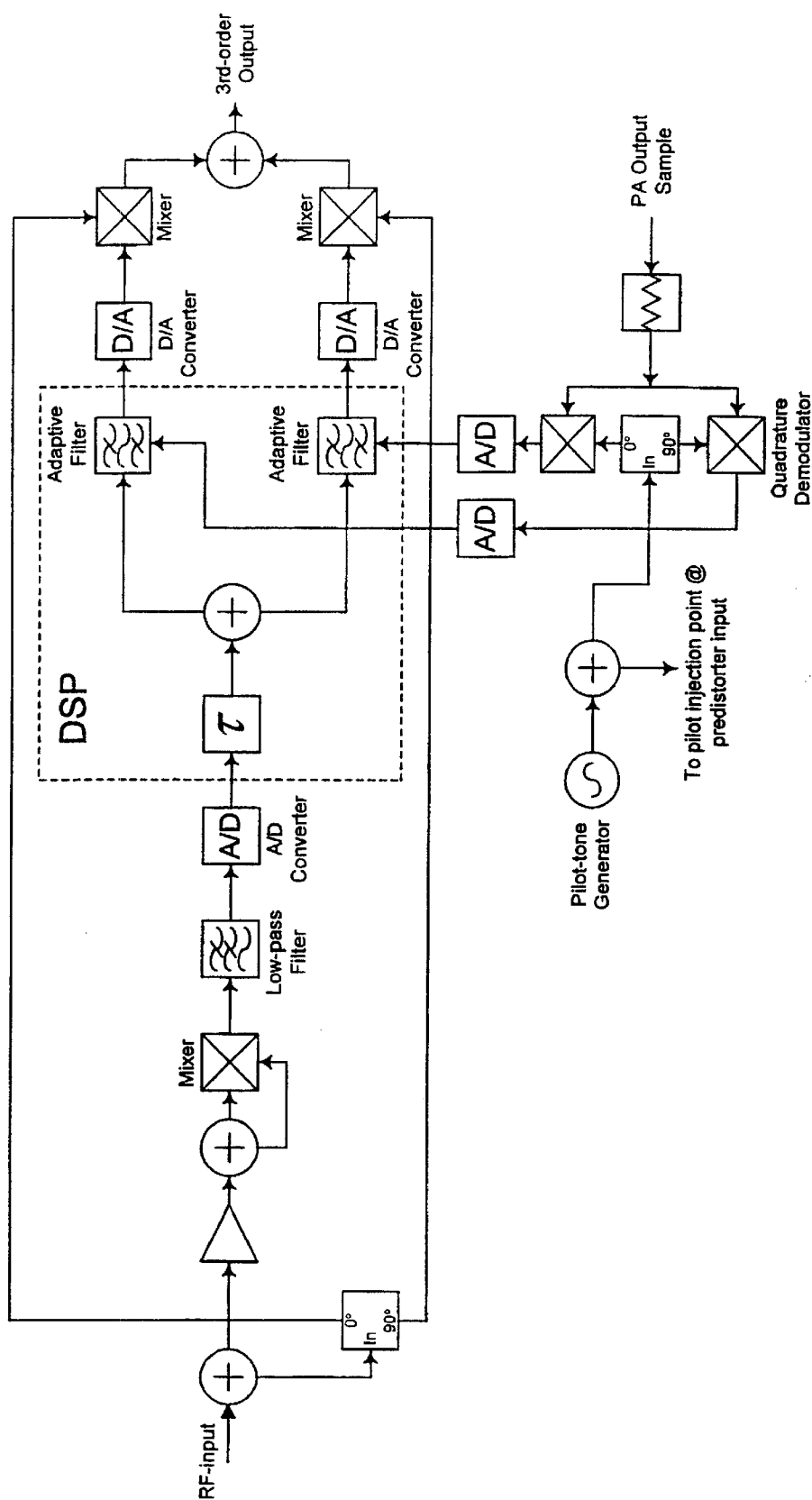
FIG. 10 illustrates the use of the DSP to perform additional functions within the predistortion circuit.

It is possible to extend the above approach a stage further and incorporate the DSP within the "base band" section of the predistortion circuit as illustrated in FIG. 10. This allows the use of independent filters for the inphase (I) and quadrature (Q) channels and a more direct correlation with the quadrature control signals, thus making the control algorithm more simple.

Figure 11:
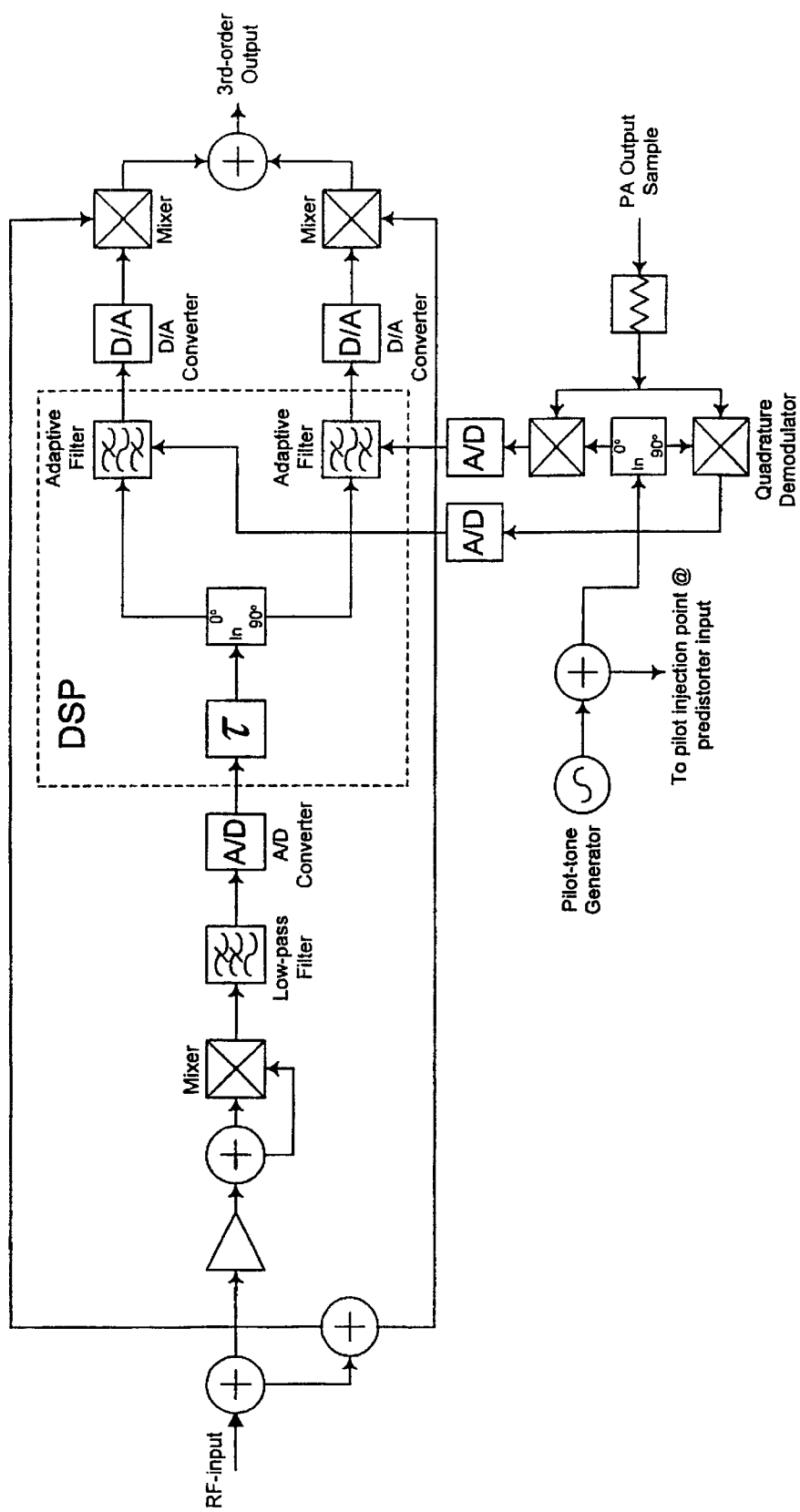
FIG. 11 illustrates a modification of the predistortion circuit of FIG. 10, in which the DSP also performs a quadrature splitting function.

FIG. 11 shows a modified version of the FIG. 10 embodiment, in which the quadrature splitting operation also occurs within the DSP, thus giving the advantage of increased accuracy for the quadrature splitting process and hence provide greater levels of IMD cancellation.

Figure 12:
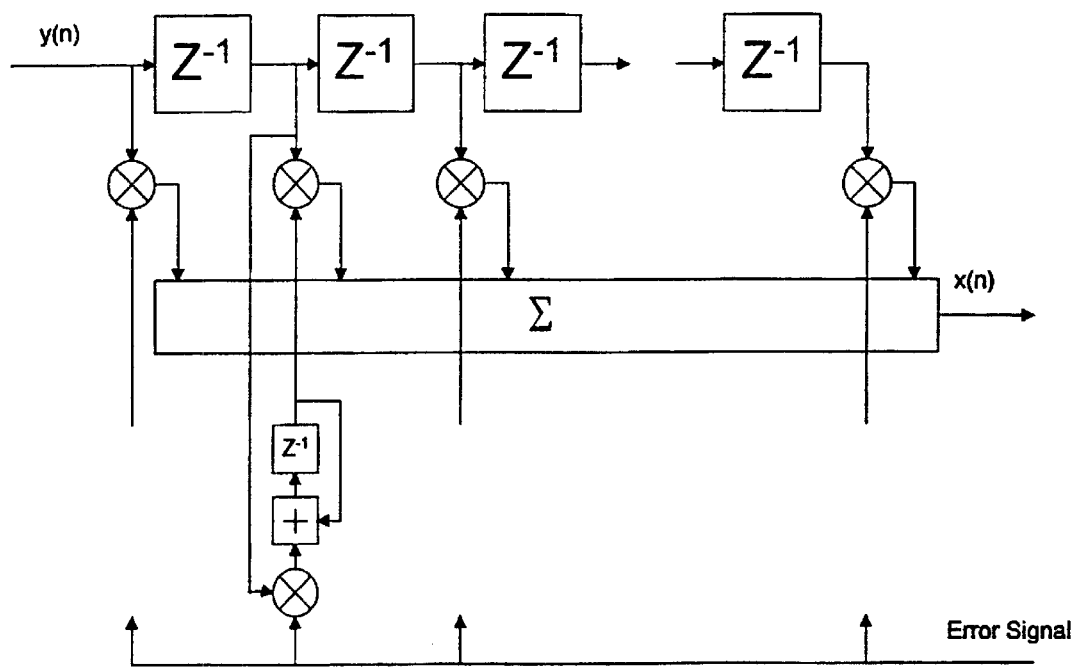
FIG. 12 is a diagram showing a portion of a filter control mechanism which may be used with the predistortion circuit of FIG. 10 or 11.
Figure 13:
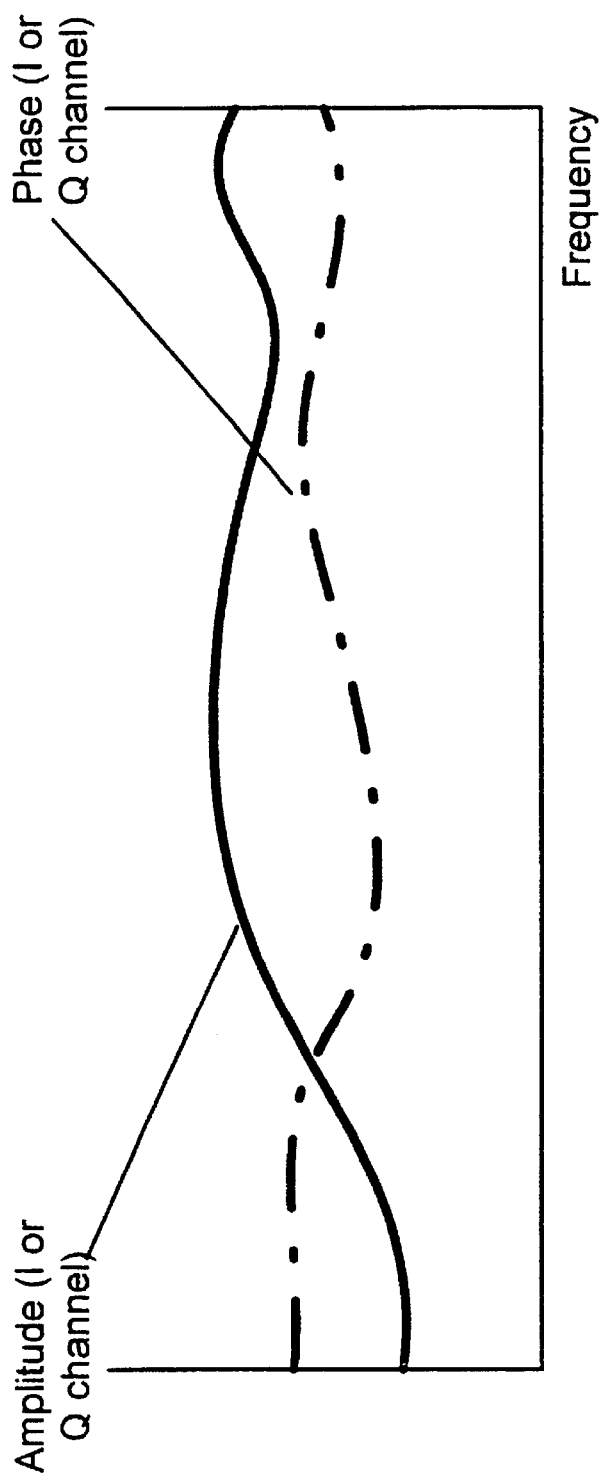
FIG. 13 is a diagram illustrating a filter spectrum after adaptation using a single broad band filter.

FIG. 12 illustrates a possible algorithm for controlling the adaption properties of a non-recursive adaptive filter implemented by a DSP. The technique uses the Least Mean Squares Error (LMSE) approach which is commonly used for filters in the communications field. (Other possible adaption algorithms include Recursive Least Squares and Stochastic Gradient). The filter allows a smooth adjustment of the gain and phase weighting of the predistortion correction signal over the chosen frequency band as illustrated in FIG. 13. If more discrete correction of the distortion components is required with frequency, then a bank of filters may be used, as shown in FIG. 14.

Figure 14:
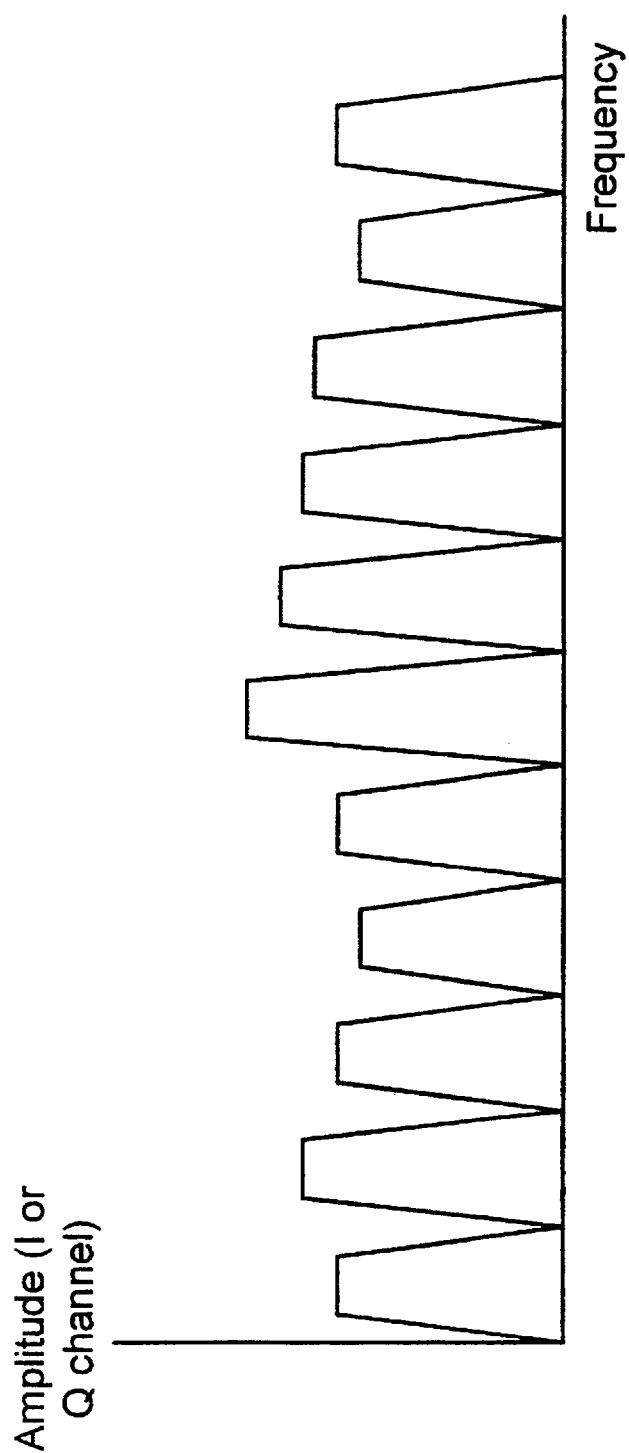
FIG. 14 is a diagram illustrating an example filter spectrum after adaption using a filter bank.

FIG. 14 shows a conceptual example of the adapted filter frequency response for one of the I or Q channels. It can be seen that differing gain values have been applied to differing frequencies within the base band signals spectrum, using a "comb" of bandpass filters. Each individual filter maybe adapted in order to optimise IMD cancellation, with the filters in the I and Q channels operating completely independently of one another.

What is claimed is:

1. Signal altering apparatus for altering an input signal to signal processing equipment so as to counter unequal intermodulation distortion in the output signal of said equipment to make it more linear, wherein the apparatus comprises a first distortion generator for generating from the input signal a first distortion signal comprising an input signal component of a first particular order for introduction into the input signal and a compensator for introducing a first variation of at least one of phase and amplitude with frequency specifically and independently into the first distortion signal.

2. Apparatus according to claim 1, wherein said generator is arranged to generate from the input signal at least one further distortion signal for introduction into the input signal such that each distortion signal comprises an input signal component of a different order and said compensator is arranged to introduce a respective variation of at least one of phase and amplitude with frequency independently into the or each distortion signal.

3. Apparatus according to claim 1, comprising at least two parallel signal paths each arranged to receive the first distortion signal, a compensating arrangement located in one of the paths, the compensating arrangement introducing said first variation into the distortion signal, and a combiner for recombining the signals issuing from said signal paths.

4. Apparatus according to claim 3, comprising a compensating arrangement in each signal path.

5. Apparatus according to claim 4, wherein the compensating arrangement comprises a delay unit.

6. Apparatus according to claim 4, wherein the compensating arrangement comprises a filter.

7. Apparatus according to claim 6, wherein the filter is arranged to perform at least one of recursive filtering and, using a bank of filters, discrete filtering.

8. Apparatus according to claim 6, wherein the characteristics of the filter are adapted in response to a feedback signal derived from the output signal of the signal processing equipment which is indicative of distortion present therein.

9. Apparatus according to claim 8, comprising an injector for injecting a pilot signal into the input signal, wherein the characteristics of the filter are adapted in response to distortion of the pilot signal present in the feedback signal derived from the output signal of the signal processing equipment.

10. Apparatus according to claim 6, comprising a controller for adapting the characteristics of the filter on the basis of one of a least mean squares error and a recursive least mean squares error algorithm.

11. Apparatus according to claim 1, comprising a Hilbert Transform unit operating on said first distortion signal to produce a filter input signal for each of two filters and a controller which quadrature demodulates a feedback signal from the output signal to produce a secondary feedback signal for each of the two filters.

12. A method of linearising an output signal of signal processing equipment by altering an input signal to said equipment so as to counter unequal intermodulation distortion in the output signal of said equipment, the method comprising the steps of generating from the input signal a first distortion signal comprising an input signal component of a first particular order for introduction into the input signal and introducing a first variation of at least one of phase and amplitude with frequency specifically and independently into the first distortion signal.

13. A method according to claim 12 comprising the steps of generating from the input signal for introduction into the input signal at least one further distortion signal such that each distortion signal comprises an input signal component of a different order and introducing a respective variation of at least one of phase and amplitude with frequency into the or each further distortion signal independently.

14. A method according to claim 12, wherein the step of generating said first distortion signal from the input signal is succeeded by the steps of supplying said first distortion signal to at least two parallel signal paths, introducing a variation of at least one of phase and amplitude with frequency into said first distortion signal in at least one of said signal paths, and recombining the signals issuing from said signal paths.

15. A method according to claim 14, comprising the step of introducing a variation of at least one of phase and amplitude with frequency in each of said signal paths.

16. A method according to claim 15, wherein the introducing step comprises a delaying step.

17. A method according to claim 15, wherein the introducing step comprises a filtering step.

18. A method according to claim 17, wherein the filtering step comprises at least one of recursive filtering, non-recursive filtering or, using a bank of filters, discrete filtering.

19. A method according to claim 17, wherein the characteristics of the filtering are adapted in response to a feedback signal derived from the output signal of the signal processing equipment which is indicative of distortion present therein.

20. A method according to claim 19, comprising the step of injecting a pilot signal into the input signal, adapting the characteristics of the filtering in response to distortion of the pilot signal present in the feedback signal derived from the output signal of the signal processing equipment.

21. A method according to claim 17, comprising the step of controlling the adaption of the characteristics of the filtering on the basis of one of a least mean squares error and a recursive least mean squares error algorithm.

22. A method according to claim 12, comprising the steps of performing a Hilbert Transform on said first distortion signal to produce a filter input signal for each of two filters and quadrature-demodulating a feedback signal from the output signal to produce a secondary feedback signal for each of the two filters.

* * * * *